(12) United States Patent
Chaudhry et al.

(10) Patent No.: US 7,151,059 B2
(45) Date of Patent: *Dec. 19, 2006

(54) MOS TRANSISTOR AND METHOD OF MANUFACTURE

(75) Inventors: Samir Chaudhry, Orlando, FL (US); Sidhartha Sen, Orlando, FL (US); Sundar Srinivasan Chetlur, Orlando, FL (US); Richard William Gregor, Winter Park, FL (US); Pradip Kumar Roy, Orlando, FL (US)

(73) Assignee: Agere Systems Inc., Allentown, PA (US)

(*) Notice: Subject to any disclaimer, the term of this patent is extended or adjusted under 35 U.S.C. 154(b) by 0 days.

This patent is subject to a terminal disclaimer.

(21) Appl. No.: 10/762,788

(22) Filed: Jan. 22, 2004

(65) Prior Publication Data

US 2004/0150014 A1    Aug. 5, 2004

Related U.S. Application Data

(62) Division of application No. 09/597,012, filed on Jun. 20, 2000, now Pat. No. 6,740,912.

(60) Provisional application No. 60/168,036, filed on Nov. 30, 1999, provisional application No. 60/140,999, filed on Jun. 24, 1999.

(51) Int. Cl.
*H01L 21/31* (2006.01)
(52) U.S. Cl. ..................... 438/770; 438/591
(58) Field of Classification Search ............... 438/770, 438/591
See application file for complete search history.

(56) References Cited

U.S. PATENT DOCUMENTS

| | | | |
|---|---|---|---|
| 4,845,047 A * | 7/1989 | Holloway et al. | 438/289 |
| 4,851,370 A | 7/1989 | Doklan et al. | |
| 5,990,516 A | 11/1999 | Momose et al. | |
| 6,025,280 A | 2/2000 | Brady et al. | |
| 6,218,276 B1 | 4/2001 | Liu et al. | |
| 6,221,764 B1 | 4/2001 | Inoue | |
| 6,274,915 B1 | 8/2001 | Krishnan et al. | |
| 6,288,425 B1 * | 9/2001 | Adan | 257/347 |
| 6,551,946 B1 * | 4/2003 | Chen et al. | 438/770 |
| 6,815,295 B1 * | 11/2004 | Ueno et al. | 438/275 |

FOREIGN PATENT DOCUMENTS

| | | |
|---|---|---|
| EP | 0 758 715 A1 | 4/1997 |
| JP | 1-204435 | 8/1989 |
| JP | 8288510 | 11/1996 |
| JP | 9045904 | 2/1997 |
| JP | 9283748 | 10/1997 |
| JP | 11026754 | 1/1999 |
| JP | 11097687 | 4/1999 |

OTHER PUBLICATIONS

U. S. Appl. No. 09/597,012 filed on Jun. 20, 2000 entitled "MOS Transistor and Method of Manufacture" to Samir Chaudhry, et al. allowed on Dec. 10, 2003.

* cited by examiner

*Primary Examiner*—Long Pham

(57) ABSTRACT

A reduced feature size MOS transistor and its method of manufacture is disclosed. The present invention reduces short channel effects but does not include an LDD structure In an illustrative embodiment, a MOS transistor has a gate length of 1.25 μm or less. The exemplary MOS transistor includes a gate oxide that forms a planar and substantially stress free interface with a substrate. As a result of the planarity and substantially stress free nature of the oxide/substrate interface, the incidence of hot carriers, and thereby, deleterious hot carrier effects are reduced. By eliminating the use of the LDD structure, fabrication complexity is reduced and series source-drain resistance is reduced resulting in improved drive current and switching speed.

15 Claims, 4 Drawing Sheets

MOS TRANSISTOR AND METHOD OF MANUFACTURE

CROSS-REFERENCE TO RELATED APPLICATION

This Application is a Divisional of prior application Ser. No. 09/597,012 filed on Jun. 20, 2000 now U.S. Pat. No. 6,740,912, to Samir Chaudhry. The above-listed Application is commonly assigned with the present invention and is incorporated herein by reference as if reproduced herein in its entirety under Rule 1.53(b).

This application claims priority of Provisional Application Ser. No. 60/168,036 which was filed Nov. 30, 1999 and Provisional Application Ser. No. 60/140,999 which was filed on Jun. 24, 1999.

FIELD OF THE INVENTION

The present invention relates integrated circuits generally, and particularly to a MOS transistor and its method of manufacture.

BACKGROUND OF THE INVENTION

As integrated circuit (IC) complexity increases, the size of devices within the IC must decrease. To decrease the size of a device, the various elements (features) of a device must be reduced proportionately. This is known as device scaling. One common device in integrated circuits is the metal oxide semiconductor field effect transistor (MOSFET). In a MOSFET, device scaling requires a reduction gate and channel lengths. As gate and channel lengths are reduced, a number of effects can result in unacceptable reliability and performance in the MOSFET. These effects are commonly referred to as short-channel effects and are particularly problematic in devices having channel lengths of approximately 1.25 μm or less.

One effect of the reduced channel length devices is increased horizontal and vertical electric field components, particularly in the drain region. This increase in the electric field can cause inversion layer carriers to be accelerated (or become "hot") to an extent that they may cause a number of harmful device phenomena, commonly referred to as hot carrier effects. Ultimately, these phenomena can adversely impact device reliability and performance.

One way to overcome hot carrier effects is through the use of a lightly doped drain (LDD) structure. In an LDD structure, the source and drain have graded doping profiles. In the source and drain regions nearest the channel, the doping level is lower, relative to the more highly doped source and drain regions farther from the channel. The lightly doped source and drain regions serve to reduce the electric field strength in the regions of the channel near the source and drain. This reduced electric field strength has been somewhat successful in reducing hot carrier generation, and thereby hot carrier effects.

While the LDD structure has been useful in reducing short channel effects such as hot carrier effects, there are certain drawbacks to its use. One such drawback is an increase in series resistance between the source and the drain (referred to as series source-drain resistance ($R_{sd}$)) This is due to the reduced doping level at the lightly doped source and drain region. This increased resistance results in a reduction in the saturation current (also referred to as drive current $I_{dsat}$ or "on" current $I_{on}$) A reduction in $I_{on}$ may result in a reduction in device switching speed. A MOSFET being used as a switch may be thought of as a device for charging and discharging a capacitor. The time required to charge the capacitor is directly related to the current. As such, if the current is reduced, the switching speed is reduced. Accordingly, this increase in $R_{sd}$ in conventional devices incorporating an LDD is undesireable.

Another drawback to the IDD structure is the complexity of its fabrication. In order to fabricate this structure, there are many additional processing steps that must be added to the process flow in. MOSFET fabrication. These include additional photolithographic masking levels, LDD implantation and the formation of a dielectric spacer.

Accordingly, what is needed is a device that overcomes the above illustrated drawbacks of LDD MOSFET devices.

SUMMARY OF THE INVENTION

The present invention relates to a reduced feature size MOS transistor that has improved short channel effects but does not include an LDD structure. In an illustrative embodiment, a MOS transistor has a gate length of 1.25 μm or less. Moreover, by eliminating the use of the LDD structure, series source-drain resistance is reduced resulting in improved drive current and switching speed.

In another embodiment, a technique for fabricating a MOS transistor is disclosed. Illustratively, a gate structure having a length of 1.25 μm or less is formed over a substrate. Thereafter, a source and a drain are formed without lightly doped regions.

BRIEF DESCRIPTION OF THE DRAWINGS

The invention is best understood from the following detailed description when read with the accompanying drawing figures. It is emphasized that the various features are not necessarily drawn to scale. In fact, dimensions of the various features may be arbitrarily increased or reduced for clarity of discussion.

DETAILED DESCRIPTION

Figure 1:
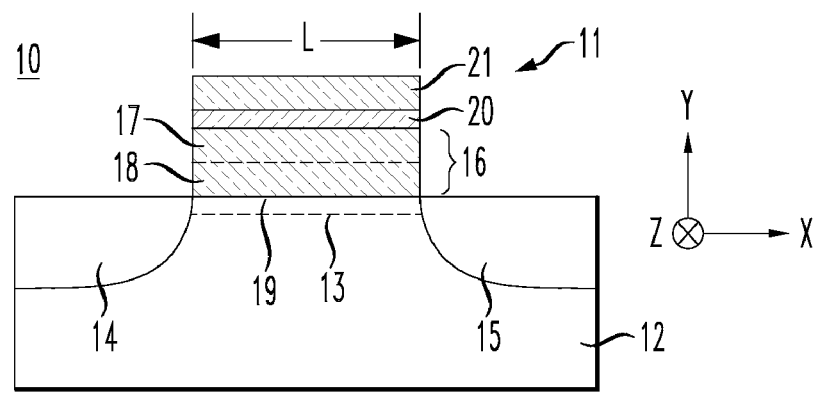
FIG. 1 is a cross-sectional view of an exemplary embodiment of the present invention.

The present invention will now be described more fully with reference to the accompanying drawing figures, in which exemplary embodiments of the present invention are shown. Referring to FIG. 1, a MOS transistor 10 in accordance with an exemplary embodiment of the present invention is first described. Illustratively, the transistor 10 includes a gate structure 11 disposed over a substrate 12. A channel 13 is disposed between a source 14 and a drain 15. The gate structure 11 includes an oxide layer 16, which includes a first oxide portion 17 and a second oxide portion 18. The second oxide portion 18 forms an interface 19 with the substrate 12. The oxide layer may have a layer of material 20 disposed between it and a conductive layer 21.

For purposes of illustration, the transistor 10 is an NMOS device. As such, the source 14 and drain 15 are doped n+, while the substrate is p-type. Of course, the present invention may be used in other devices including PMOS and complementary MOS (CMOS) devices. The substrate 12 is illustratively silicon; it may be monocrystalline or polycrystalline silicon. Most generally it is oxidizable silicon. Layer 20 may be a high-k material, including but not limited to tantalum pentoxide, barium-strontium titanate, and silicate dielectric materials. Additionally, other materials may be disposed between the conductive layer 21 and the oxide layer 16 to achieve a variety of results as would be appreciated by the artisan of ordinary skill.

The MOS field effect transistor of the exemplary embodiment of FIG. 1, does not incorporate a lightly doped drain or a lightly doped source. This is in clear contrast to conventional devices having gate lengths of approximately 1.25 μm or less which employ an LDD structure to mitigate hot carrier effects. In the exemplary embodiment shown in FIG. 1 the device 10 may have a gate length (and thus a channel length), L, on the order of approximately 1.25 μm or less. Moreover, sub-micron devices may incorporate the present invention. It is anticipated that the gate lengths may be in the range of approximately 0.25 μm to approximately 0.05 μm. Finally, as is well known in the art, device scaling mandates that the gate length and other device features must be proportional according to scaling rules. Thus, the oxide layer 16 has a thickness that is scaled to the gate length chosen. Accordingly, in the illustrative embodiment, gate lengths in the range of approximately 1.25 μm to approximately 0.05 μm corresponds to the oxide layer 11 having a thickness in the range of approximately 20.0 nm to approximately 1.5 nm, respectively.

The oxide/substrate interface 19 is substantially stress-free and planar.

Moreover, oxide layer 16 has a reduced number of interface traps ($N_{it}$) and a reduced defect density ($D_o$) compared to conventional oxides. These and other characteristics of the oxide layer 16 are useful in achieving the invention of the present disclosure. Further details of the oxide and its characteristics may be found in U.S. patent application Ser. No. 09/597,077, entitled "High Quality Oxide For Use In Integrated Circuits", the disclosure of which is specifically incorporated by reference herein. (This patent application is assigned to the assignee of the present invention, and is filed on even date herewith).

As discussed in more detail below, the device of the present invention has certain advantageous characteristics over conventional devices. These characteristics include an improvement in drive current and switching speed. Moreover, this increase in drive current may be realized even though the channel may require an increased doping level used to curb an undesired short channel effect known as punch-through (discussed more fully herein). Additionally, the effects of hot carriers, which can result in a degradation in device reliability, can be minimized in devices using the present invention. Finally, the present invention is advantageous because it reduces the complexity of fabrication. To this end, the relatively complex processing sequences needed to form: LDD structures, which are considered a necessary trade-off in conventional short channel length devices, are unnecessary in the present invention.

Figure 2A:
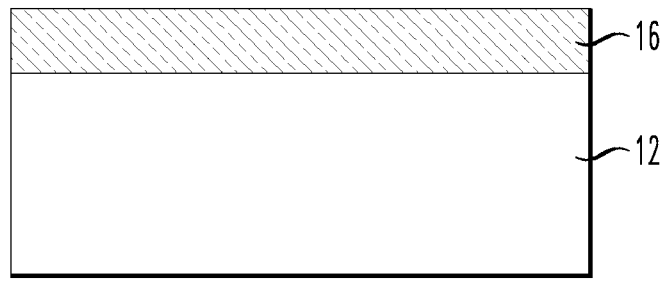
FIGS. 2–4 are cross-sectional views of an illustrative fabrication sequence according to an exemplary embodiment of the present invention.
FIG. 2b illustrates an exemplary sequence for fabricating an oxide layer according to the present invention.
Figure 2B:
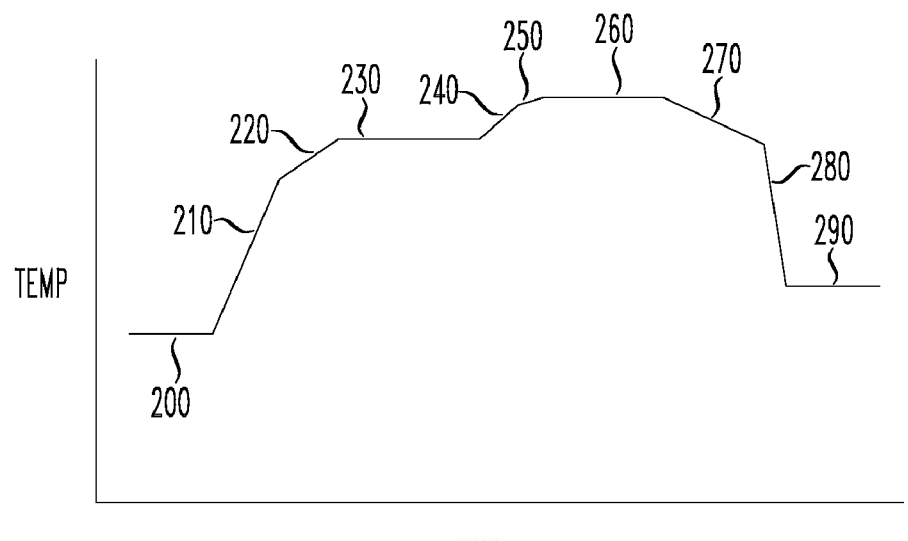
Figure 3:
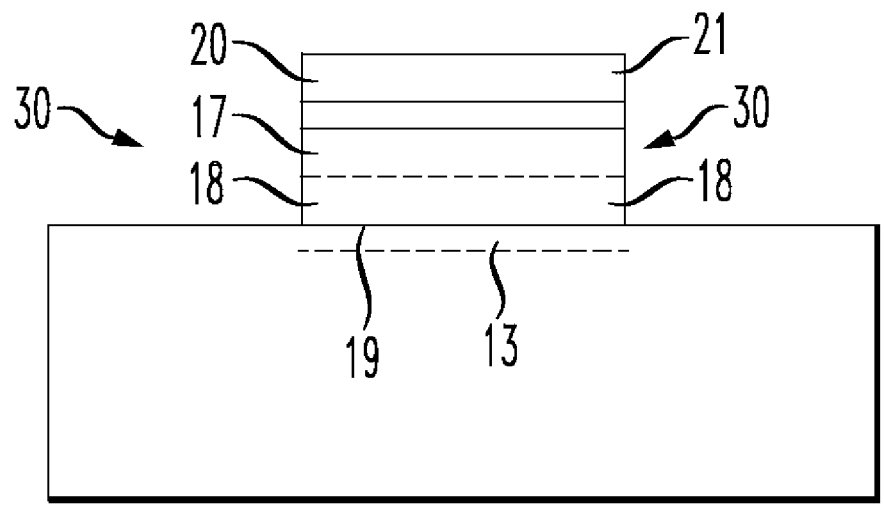
Figure 4:
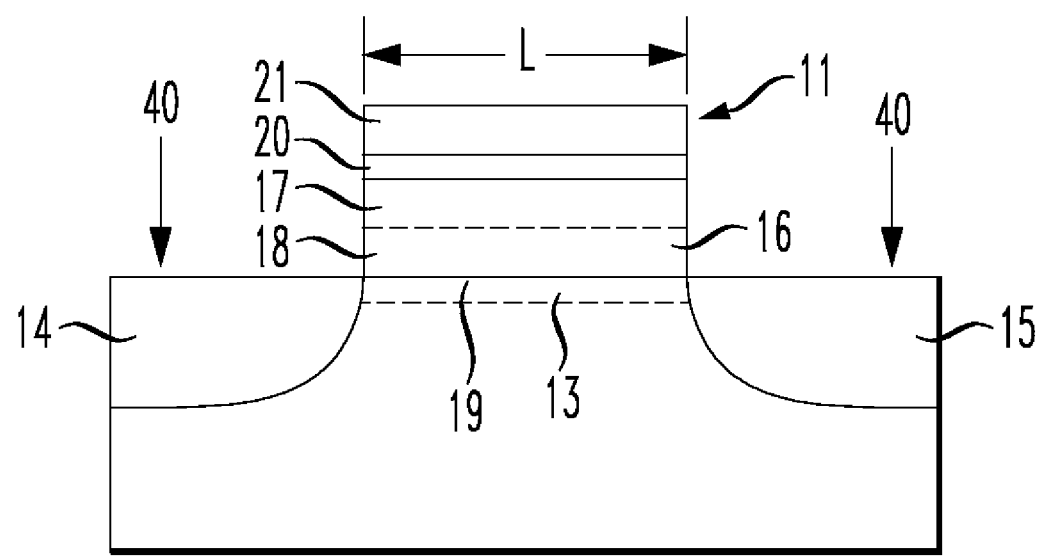

Turning now to FIGS. 2–4, an illustrative fabrication sequence is described. FIG. 2 is the oxide growth sequence used in the formation of oxide layer 16 over the substrate 13, resulting in the formation of a substantially stress free and planar interface 19. Referring to FIG. 2b, illustrated is an exemplary sequence for fabricating an oxide layer according to the present invention is shown. Segment 200 indicates a wafer boat push step at an initial temperature of approximately 300° C.–700° C., with nitrogen flow of 8.0 L/min and 0.02 to 1% ambient oxygen concentration. These parameters are chosen to minimize the growth of native oxide, which can degrade oxide quality as well as consume the allowed oxide thickness determined by scaling parameters (referred to as oxide thickness budget or scaling budget). Additionally, a load lock system or a hydrogen bake, well known to one of ordinary skill in the art, can be used to impede the growth of this undesirable low-temperature oxide.

Segment 210 is a rapid upward temperature increase at approximately 50–125° C. per minute to about 750° C.–850° C. This step is carried out at a very low oxygen ambient concentration (on the order of 0.050% to 5%) and a high nitrogen ambient. One aspect of the present embodiment relates to the step of upwardly ramping the temperature at a relatively high rate (segment 210) to minimize the thickness of the oxide formed in this segment (known as the ramp oxide). This helps control the overall thickness of the oxide 16. Thus, through this step, the desired higher growth temperatures (segments 230 and 260) may be attained without sacrificing the oxide thickness budget. Moreover, this rapid rise in temperature at low ambient oxygen concentrations retards the growth of lower temperature oxide, which may be of inferior quality, as discussed above.

Segment 220 is a more gradual increase in temperature. Segment 220 proceeds at approximately 10–25° C. per minute. In the exemplary embodiment the temperature reached at the end of segment 220 is in the range of approximately 800° C. to 900° C. The same oxygen and nitrogen flows/concentrations used in segment 210 are maintained in segment 220. This control of the ramp up in temperature in segment 220 is also important as it helps to prevent overshooting the growth temperature of segment 230. Finally, the low concentration of oxygen in segment 220 selectively retards the growth of oxide during the temperature increase to a higher growth temperature. Again this helps to preserve the oxide thickness budget.

Segment 230 is a low temperature oxide (LTO) growth step. In this step, the ambient oxygen concentration is about 0.10% to about 10% while the ambient nitrogen concentration is 90–99.9%. Dichloroethylene may be added at 0–0.5% for a time that is dependent upon the desired thickness as would be appreciated by one of ordinary skill in the art. At the end of segment 230, an anneal in pure nitrogen may be carried out. In the illustrative sequence of FIG. 2b, during segments 200–220 an oxide is grown having a thickness in the range of 0.5–1.0 nm. Segment 230 results in the growth of approximately 0.25–1.0 nm of oxide. Upon completion of segment 230, the growth of the first oxide portion is completed. Illustratively, this first oxide portion is grown at a temperature lower than the viscoelastic temperature of silicon dioxide ($T_{ve}$), which is approximately 925° C. The first oxide portion may comprise 25–98% of the total thickness of the oxide layer. In an exemplary embodiment in which the oxide layer 16 has a thickness of 3.0 nm or less, the first oxide portion has a thickness of approximately 0.75–2.0 nm. As discussed more fully herein, applicants theorize that the first oxide portion acts as a sink for stress relaxation that occurs during the growth of second oxide portion under first oxide portion.

Segment 240 is the first segment in the temperature increase to a temperature above the viscoelastic temperature of silicon dioxide. This ramp up in temperature occurs relatively slowly, at a rate of approximately 5–15° C. per minute and in a nearly pure, nitrogen ambient (the ambient concentration of oxygen in this segment is illustratively 0%–5%). The temperature reached at the end of segment 240 is approximately 50° C. below the high temperature oxide (HTO) growth temperature of segment 260. Segment 250 is a modulated heating segment in which the temperature is increased at a rate of approximately 5–10° C. per minute to a temperature above the viscoelastic temperature. In the illustrative embodiment the HTO growth temperature is in the range of 925–1100° C. The same flows/concentration of oxygen and nitrogen of segment 240 are used in segment 250. At the end of segment 250, the HTO growth temperature is reached.

Segments 240 and 250 are useful steps in the exemplary embodiment of the present invention. As was the case in the temperature ramp-up to segment 230 the (LTO growth segment) the careful ramp-up of temperature in segments 240 and 250 prevents overshooting the desired growth temperature, in this case the HTO growth temperature of the present invention. The rate of temperature increase at the illustrated low ambient oxygen concentration is useful in retarding oxide growth thereby preserving the oxide thickness budget. Finally, applicants believe that the careful heating in a low oxygen ambient in segments 240 and 250 reduces growth stress, and consequently reduces the occurrence of oxide growth defects (e.g., slip dislocations and stacking faults).

Segment 260 is the HTO growth step, where the growth temperature is illustratively above the viscoelastic temperature of silicon dioxide. The temperature achieved at the end of segment 250 is maintained in the growth step in segment 260 in a 25% less oxygen ambient for approximately 2 to 20 minutes so that an additional 0.2–1.2 nm of oxide may be grown at high temperature. The second portion may comprise on the order of 2–75% of the total thickness of the oxide layer 16. The final portion of segment 260 may include an anneal in pure nitrogen. Applicants believe (again without wishing to be bound to such a belief) that the high temperature growth above the viscoelastic temperature (approximately 925° C.) results in the growth of an oxide (second oxide portion 32) having certain properties.

Segment 270 of the exemplary embodiment of FIG. 2b is a cooling segment also referred to as a modulated cooling segment. A temperature ramp down is carried out at a rate of approximately 2–5° C. per minute to a temperature at the end of segment 270 which is below the viscoelastic temperature. For example, the temperature reached at the end of segment 270 is in the range of 900–800° C. Segment 270 is carried out in a nearly pure nitrogen ambient, which is inert. During the cooling of a grown oxide to below the viscoelastic temperature, stress may result in the oxide, particularly at the substrate-oxide interface. As a result of this stress, defects such as slip dislocations and oxidation induced stacking faults may be formed at energetically favored sites such as heterogenities and asperities. These defects may be viewed as routes for diffusional mass transport and leakage current paths which can have a deleterious impact on reliability and device performance. The modulated cooling segment, and the stress absorbing or stress sink characteristics of the first oxide portion (particularly during the modulated cooling segment) results in a substantially stress free oxide-substrate interface. Moreover, the defect density is reduced. Finally, segment 280 represents a further ramp down at a faster rate on the order of approximately 35–65° C. per minute in an inert ambient such as pure nitrogen. Segment 290 is the boat pull at about 500° C. in a pure nitrogen ambient. Thereafter, as shown in FIG. 3, the gate structure 11 is completed via conventional processing schemes which may include: deposition of a high-k layer; amorphous silicon or polycrystalline silicon deposition, gate implantation and gate masking steps.

As shown in FIG. 3, after the gate structure 11 is completed, the channel 13 is formed. This may be carried out by standard implantation techniques. The channel doping is raised via tilted "halo" or "pocket" implants 30 of the same conductivity type as the channel. For the exemplary NMOS device, an implant such as boron in the energy range of 5–40 keV, a dose in the range of approximately $5 \times 10^{11}$ to approximately $5 \times 10^{13}/cm^2$, at an implant tilt angle in the range of 7–45° (with respect to a normal to the substrate) may be used. Similarly, for a PMOS device a phosphorus implant in the energy range of 20–120 keV, a dose in the range of approximately $5 \times 10^{11}$ to approximately $5 \times 10^{13}/cm^2$, at an implant tilt angle in the range of 7–45° may be used. The illustrative channel doping concentration is now in the range of approximately $1 \times 10^{16}$ to approximately $1 \times 10^{19}$ /cm$^3$. This channel doping step serves to reduce punch-through and thus short channel effects in the devices.

As shown in FIG. 4, after the halo implantation, the source 14 and drain 15 are formed. In the exemplary NMOS device, this is carried out by implanting arsenic in the energy range of 5–50 keV, a dose in the range of approximately $5 \times 10^{14}$-to approximately $5 \times 10^{15}/cm^2$, and an implant tilt angle in the range of 0–7°. Similarly, for the PMOS device the source and drain is formed via a boron implant in the energy range of 0.5–10 keV, a dose in the range of approximately $5 \times 10^{14}$-to, approximately $5 \times 10^{15}/cm^2$, and a implant tilt angle in the range of 0–7°. Alternatively, a BF$_2$ implant in the energy range of 5–50 keV, a dose range of approximately $5 \times 10^{14}$-to approximately $5 \times 10^{15}/cm^2$, and a implant tilt angle in the range of 0–7°. The resulting doping levels in the source and drain are in in the range of approximately $1 \times 10^{20}/cm^3$ to approximately $5 \times 10^{20}/cm^3$. In clear contrast to the prior art LDD devices, the source 14 and drain 15 in the illustrative embodiment of FIGS. 1 and 4 are substantially uniformly doped, and do not include a lightly doped region.

Through a review of FIGS. 2–4, the relative ease of fabrication of the illustrative embodiment may be appreciated. The process needed to fabricate conventional short channel devices includes the fabrication of an LDD. At minimum, this adds a mask formation step so that a first implantation could be carried out. This is needed to form the lightly doped source and drain regions. Thereafter, a spacer must be deposited and etched. In conventional LDD devices, the spacer is needed in the fabrication of the more heavily doped regions of the source and drain. In addition to adding to the complexity of fabrication, the added implants and spacer may have deleterious effects on the resultant device. These include, for example increased series source/drain resistance, $R_{sd}$, and thus reduced saturated drive current $I_{dsat}$, and switching speed.

As mentioned previously, hot carrier effects can adversely impact device reliability. In MOS transistors having gate lengths of approximately 1.25 microns or less, hot carrier effects result from increased horizontal and vertical components of the electric field in the reduced length channel. This causes inversion layer charges to be accelerated (or heated) to an extent that they may cause a number of harmful device phenomena, commonly referred to as hot carrier effects. Hot carrier effects can ultimately degrade the reliability of the device. This is commonly referred to as hot carrier aging (HCA).

Hot carrier aging is believed to be due to interface trap generation or the breaking of passivated dangling bonds by hot carriers. Dangling bonds in the silicon-silicon dioxide interface are conventionally passivated in a hydrogen ambient, thereby reducing the number of interface traps. While this passivation technique has met with some success in conventional devices, hot carriers can readily break silicon-hydrogen bonds, thereby re-establishing the previously passivated interface traps. The traps in the interface act as scattering centers, thereby reducing the mobility of carriers within the channel.

As is known, the drive current, $I_{on}$ (or saturation current, $I_{dsat}$), and the transconductance, $g_m$ are directly proportional to the mobility of the carriers in the channel. Accordingly, as the scattering centers become more abundant due to hot carrier effects, the mobility of carriers in the channel is reduced, and the drive current and transconductance are reduced. Thus, the number of interface traps can cause the device to degrade (age) due to drift in device parameters such as drive current and transconductance. This degradation has a deleterious impact on device reliability.

Figure 5:
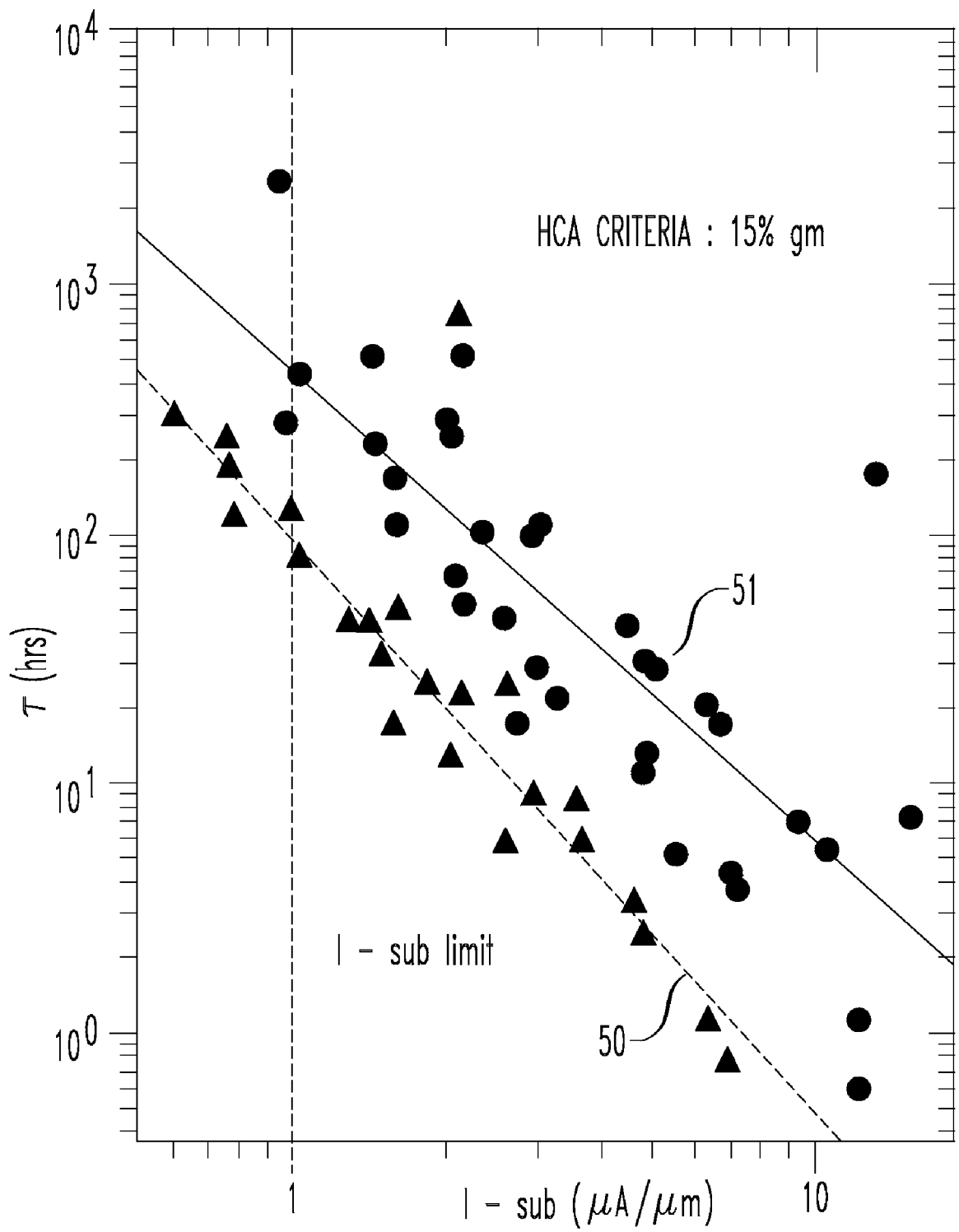
FIG. 5 is a graphical representation of time versus substrate current indicative of hot carrier aging (HCA) according to an exemplary embodiment of the present invention and for a conventional device.

The oxide layer 16 has a reduced incidence of dangling silicon bonds, and thereby a reduced number of interface traps. Applicants theorize that this is a result of a more complete oxidation process and because the interface is substantially stress-free and planar. Moreover, since there are fewer interface traps in the oxide of the present invention, there are fewer traps to be passivated with hydrogen. It is anticipated that there will be less device drift due to hydrogen release in devices which incorporate the oxide of the present invention. Finally, while the LDD structure has helped to reduce hot carrier effects in short channel devices, the illustrative embodiment of the present invention results in a greater reduction in hot carrier effects The resulting improvement in hot carrier aging can be seen clearly in the graphical representation of FIG. 5. The hot carrier aging criteria by convention is a 15% change in transconductance. The plot labeled 51 is for a device according to an illustrative embodiment of the present invention incorporating a 0.24 µm gate length with an oxide layer having a thickness of 5 nm (50A). The plot labeled 50 is for a conventional device having the same gate length, which incorporates an LDD structure to reduce the ill-effects of hot carriers. As is evident from FIG. 5, the substrate current limit of 1 µA/µm is achieved at 100 hours in a conventional LDD MOSFET; and in an exemplary device of the present invention this is limit achieved at 400 hours. As will be readily appreciated to those of ordinary skill in the art, in devices having comparable gate lengths, hot carrier aging is improved by a factor of four by the present invention when compared to conventional devices, which require the LDD structure.

In addition to improvements in reliability through reduced HCA, the device of the present invention also has increased drive current as a result of both increased carrier mobility and reduced source-drain resistance. The increased mobility is a result of the reduction in scattering centers, as discussed above. The reduction in $R_{sd}$ is a direct benefit of the elimination of the lightly doped source and drain regions used in conventional LDD structures. To this end, because the incidence of hot carriers is reduced by means other than the LDD structure, it is not needed in the exemplary device of the present invention. Accordingly, the source and drain doping levels of the present invention are substantially uniform being in the range of approximately $1 \times 10^{20}$ to approximately $5 \times 10^{20}/cm^3$. This results in a source-drain sheet resistance in the range of approximately 50 to approximately 150 ohms/sq. This translates directly into $R_{sd}$ of approximately 25 to approximately 100 ohms per µm of gate width in an exemplary device of the present invention. (It is of interest to note that by convention, gate width is measured along the z-direction in the coordinate axis shown in FIG. 1). In contrast, the lightly doped regions of a conventional lightly doped source and lightly doped drain are on the order of $1 \times 10^{19}$ to $5 \times 10^{19}/cm^3$. The corresponding source/drain sheet resistance of a conventional LDD is in the range 500–1500 ohms/sq. This results in $R_{sd}$, of 100–200 ohms per µm of gate width in such conventional devices.

Figure 6:
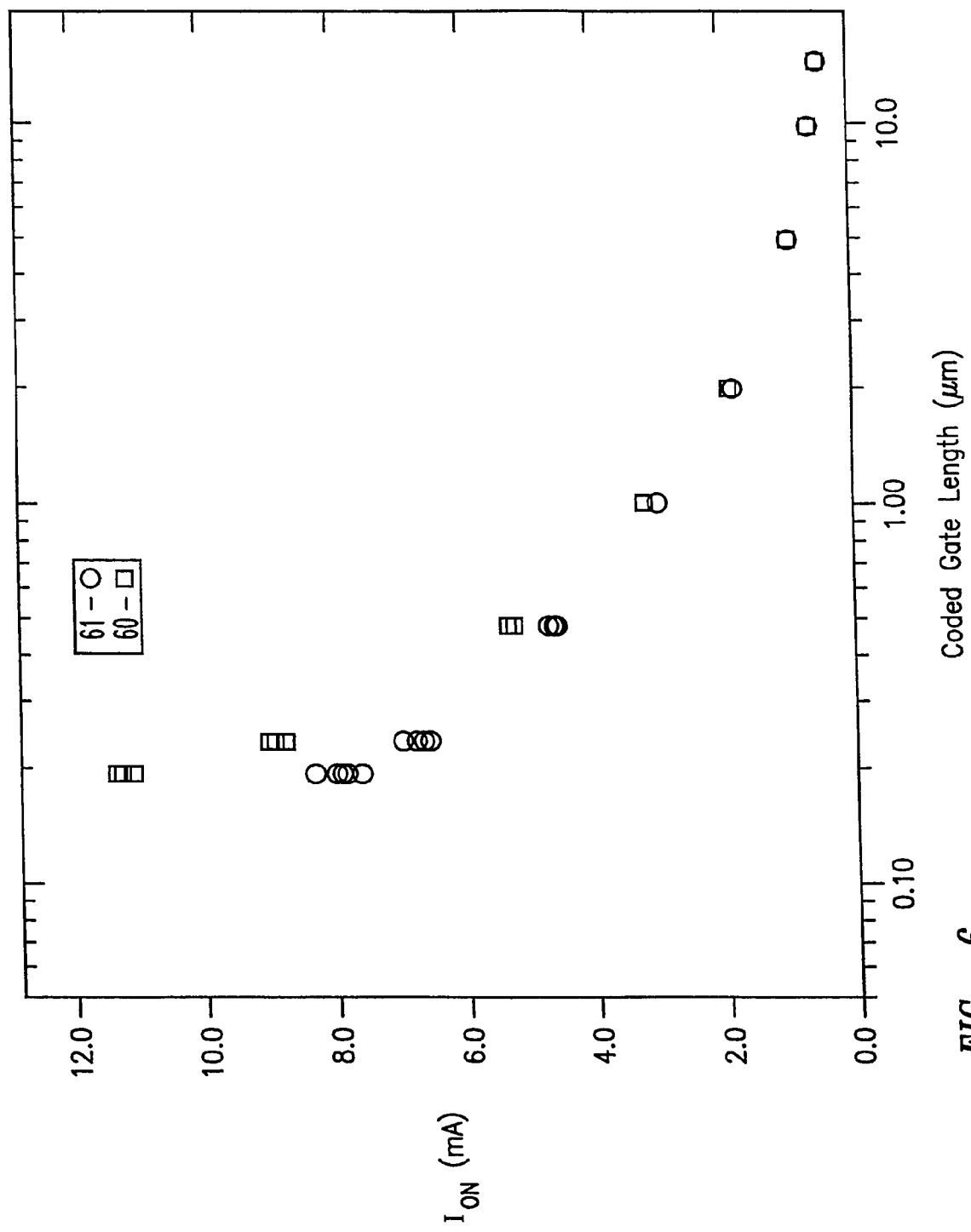
FIG. 6 is a graphical representation of drive gate length versus drive current for conventional devices which use an LDD structure and for exemplary devices of the present invention.

As a result of the reduction in the series source drain resistance by virtue of the present invention, the drive current is improved. Turning to FIG. 6, a graphical representation of gate length versus drive current is shown. Plot 60 is a graph of the drive current of exemplary devices of the present invention. Plot 61 is for conventional devices which use an LDD structure. Clearly, an improvement in transistor drive current, $I_{dsat}$, is measured in illustrative devices of the present invention when compared to conventional device having similar feature sizes, and which incorporate an LDD structure.

As alluded to above, the increased drive current results in a faster switching speed. Again, a MOSFET being used as a switch may be thought of as a device that charges and discharges a capacitor. These capacitors are intrinsic parts of CMOS circuits arising from such elements as MOS gate capacitance, source/drain junction capacitance, and metal interconnect capacitance. The time required to charge the capacitor is directly related to the current. As such, if the drive current is increased, the switching speed is increased. Having improved drive current levels results in a ring oscillator circuit using exemplary MOSFETs of the present invention having switching speeds on the order of 25% greater than conventional LDD MOS transistors Moreover, this increase in the drive current in the exemplary device of the present invention is realized even though the threshold voltage $V_t$ may be slightly increased. To this end, one phenomena that may occur in reduced channel length devices is known as punch-through. Punch through is normally observed when the applied gate voltage is well below $V_t$. Punch-through occurs when the drain depletion region widens when the reverse bias on the drain is increased. When this depletion region width is great enough, the source and drain depletion regions may meet and an unacceptable level of carrier flow may occur. This results in poor charge control, and is manifest in unacceptable off current levels. While the LDD structure, having reduced doping levels at the source, and drain regions nearest the channel may reduce the effects of punch through, often this must be mitigated by increasing the doping level of the channel to reduce the drain/source depletion region width. However, the increased channel doping concentration can increase the threshold voltage as a greater voltage is required to create inversion for conduction in the channel. The increased threshold: voltage may cause a reduction in the drive current. Thus, the trade-off to the reduction in punch through via increased channel doping is often a reduction in drive current in conventional LDD devices.

Applicants have found that the exemplary device of the present invention maintains an increase in the drive current in spite of the increase in threshold voltage. Illustratively, in a 0.24 µm feature size device, the drive current increased 20% over a similar conventional LDD device having similar device feature sizes. This was in spite of a 50 mV increase in the threshold voltage. Applicants attribute this to the reduction in the series source-drain resistance realized through the invention of the present disclosure.

The invention having been described in detail, it is clear that various modification and variations of the embodiments disclosed above may be readily apparent to one having ordinary skill in the art having had the benefit of the present disclosure. To the extent that these modifications and variations include the invention, a transistor that mitigates short channel effects without the use of an LDD structure, such are deemed within the scope of the present invention.

What is claimed:

1. A process for fabricating an integrated circuit, comprising:
    forming an oxide over a substrate, said oxide being defined by a width, said forming said oxide including
        (a) exposing said substrate to a first oxidizing ambient, wherein exposing said substrate to a first oxidizing ambient includes increasing from an initial temperature to a first temperature below a threshold temperature at a first ramp rate, increasing from said first temperature to a second temperature below said threshold temperature at a second ramp rate, and growing at least a portion of said oxide;
        (b) exposing said substrate to a second oxidizing ambient, wherein exposing said substrate to a second oxidizing ambient includes increasing from said second temperature to a third temperature at a third ramp rate, and increasing from said third temperature to a temperature above said threshold temperature at a fourth ramp rate; and
        (c) cooling said substrate to a temperature below said threshold temperature, wherein said oxide and said substrate form an interface that is substantially stress free and planar;
    forming within said substrate a source, a drain and a channel extending from said source to said drain, wherein said source and said drain do not include lightly doped regions; and
    forming a gate structure over said substrate, said gate structure having a length of approximately 1.25 μm or less and being coextensive with said width of said oxide.

2. A process as recited in claim 1, wherein said process further comprises forming said channel before forming said source and said drain.

3. A process as recited in claim 2, wherein said channel is doped by a halo implantation.

4. A process as recited in claim 1, wherein said length is in the range of approximately 0.25 μm to approximately 0.05 μm.

5. A process as recited in claim 1, wherein said oxide layer has a first oxide portion and a second oxide portion.

6. A process as recited in claim 1, wherein a spacer is not formed adjacent said gate structure.

7. A process as recited in claim 1, wherein said oxide layer has a thickness in the range of approximately 1.5 nm to approximately 20.0 nm.

8. A process as recited in claim 1, wherein said source and said drain have doping levels in the range of approximately $1 \times 10^{20}/cm^3$ to $5 \times 10^{20}/cm^3$.

9. A process as recited in claim 1, wherein said channel has a doping level in the range of approximately $1 \times 10^{16}/cm^3$ to approximately $1 \times 10^{19}/cm^3$.

10. The process as recited in claim 1, wherein said first temperature below said threshold temperature is approximately 750° C.–850° C. and said first ramp rate is approximately 50° C.–125° C. per minute.

11. The process as recited in claim 1, wherein said second temperature below said threshold temperature is approximately 800° C.–900° C. and said second ramp rate is approximately 10° C.–25° C. per minute.

12. The process as recited in claim 1, wherein said substrate is oxidizable silicon and said threshold temperature is the viscoelastic temperature of $SiO_2$.

13. The process as recited in claim 1, wherein step (b) further comprises:
    increasing from said second temperature to said third temperature at a ramp rate of approximately 5–15° C. per minute in an ambient oxygen concentration of approximately 0%–5%;
    increasing from said third temperature to said temperature above said threshold temperature at a ramp rate of 5–10° C. per minute in an ambient oxygen concentration of approximately 0%–5%; and
    growing at least a portion of said oxide in an oxygen ambient concentration of about 25% or less.

14. The process as recited in claim 1, wherein step (c) further comprises:
    reducing from said temperature above said threshold temperature to approximately 800° C. to 900° C. at a rate of about 2° C.–5° C. per minute; and
    reducing said temperature of approximately 800° C. to 900° C. to a boat pull temperature at a rate of about 35° C.–65° C. per minute, wherein said oxide portion formed in step (a) is a first oxide portion and acts as a stress sink to a second oxide portion formed in step (b) during at least a portion of said cooling.

15. The process as recited in claim 14, wherein said threshold temperature is the viscoelastic temperature of $SiO_2$.

* * * * *